(12) United States Patent
Lin et al.

(10) Patent No.: US 11,164,858 B2
(45) Date of Patent: Nov. 2, 2021

(54) INTEGRATED CIRCUITS AND METHODS OF FORMING INTEGRATED CIRCUITS

(71) Applicant: GLOBALFOUNDRIES Singapore Pte. Ltd., Singapore (SG)

(72) Inventors: Benfu Lin, Singapore (SG); Bo Yu, Singapore (SG); Chim Seng Seet, Singapore (SG); Kin Wai Tang, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/816,365

(22) Filed: Mar. 12, 2020

(65) Prior Publication Data

US 2021/0288042 A1    Sep. 16, 2021

(51) Int. Cl.
| | | |
|---|---|---|
| *H01L 21/00* | (2006.01) | |
| *H01L 27/01* | (2006.01) | |
| *H01L 21/70* | (2006.01) | |
| *H01L 49/02* | (2006.01) | |

(52) U.S. Cl.
CPC .......... *H01L 27/016* (2013.01); *H01L 21/707* (2013.01); *H01L 28/20* (2013.01); *H01L 28/60* (2013.01)

(58) Field of Classification Search
CPC ..... H01L 27/016; H01L 21/707; H01L 28/20; H01L 28/60
See application file for complete search history.

(56) References Cited

U.S. PATENT DOCUMENTS

| 8,445,353 B1 | 5/2013 | Raghavan et al. | |
|---|---|---|---|
| 2002/0197844 A1* | 12/2002 | Johnson | H01L 23/5223 438/618 |
| 2005/0064658 A1 | 3/2005 | Biery et al. | |
| 2013/0341759 A1 | 12/2013 | Khan et al. | |
| 2016/0141283 A1 | 5/2016 | Dirnecker | |
| 2018/0151445 A1* | 5/2018 | Hsu | H01L 21/0217 |
| 2020/0126976 A1* | 4/2020 | Chen | H01L 23/5228 |

* cited by examiner

*Primary Examiner* — Richard A Booth
(74) *Attorney, Agent, or Firm* — Viering Jentschura & Partner mbB

(57) ABSTRACT

According to various embodiments, an integrated circuit may include an upper inter-level dielectric (ILD) layer, a lower ILD layer, and an interlayer arranged between the upper ILD layer and the lower ILD layer. The integrated circuit may further include a capacitor device and a resistor device. The capacitor device may include a top plate disposed in a first region of the interlayer and a bottom plate disposed in the lower ILD layer. The resistor device may include a resistive element and a plurality of vias disposed in a second region of the interlayer. The plurality of vias may extend from the resistive element to the lower ILD layer. A distance between the top plate and the lower ILD layer may be at least substantially equal to a height of each via of the plurality of vias.

20 Claims, 14 Drawing Sheets

INTEGRATED CIRCUITS AND METHODS OF FORMING INTEGRATED CIRCUITS

TECHNICAL FIELD

Various embodiments relate to integrated circuits and methods of forming integrated circuits, in particular, integrated circuits that include capacitors and resistors.

BACKGROUND

Capacitors and resistors are essential components in virtually every electrical circuit. In semiconductor devices, it is desirable for capacitors to be small in size while having large capacitances. A thin film capacitor, such as a metal-insulator-metal (MIM) capacitor, may be capable of achieving a large capacitance while being small in size. A MIM capacitor is typically formed within the interconnect layers of an integrated circuit. Thin film resistors (TFR), typically made of deposited homogenous metal thin film, offer technical advantages in terms of low temperature coefficient of resistance, smooth electron flow and long term stability, which make them suitable for use in high precision radio frequency applications. Semiconductor devices often require both capacitors and resistors to be integrated onto a small area. In conventional semiconductor fabrication processes, the MIM capacitor and the TFR are fabricated separately. The thin film suitable for forming the TFR is typically too resistive to be used as the MIM capacitor plate. Also, the thinness of the TFR usually necessitates a special patterning and etching process to form good electrical contact without damage to the thin resistor material. As such, adding a TFR to an integrated circuit including a MIM capacitor and vice-versa, typically results in significant additional cycle time and cost.

SUMMARY

According to various embodiments, there may be provided an integrated circuit. The integrated circuit may include an upper inter-level dielectric (ILD) layer, a lower ILD layer, and an interlayer arranged between the upper ILD layer and the lower ILD layer. The integrated circuit may further include a capacitor device and a resistor device. The capacitor device may include comprising a top plate disposed in a first region of the interlayer and a bottom plate disposed in the lower ILD layer. The resistor device may include a resistive element and a plurality of vias disposed in a second region of the interlayer. The plurality of vias may extend from the resistive element to the lower ILD layer. A distance between the top plate and the lower ILD layer may be at least substantially equal to a height of each via of the plurality of vias.

According to various embodiments, there may be provided a method of forming an integrated circuit. The method may include providing an upper ILD layer, a lower inter-level dielectric layer, and an interlayer arranged between the upper ILD layer and the lower ILD layer. The method may further include forming a capacitor device that includes a top plate disposed in a first region of the interlayer, and a bottom plate disposed in the lower ILD layer. The method may further include forming a resistor device that includes a resistive element and a plurality of vias disposed in a second region of the interlayer. The plurality of vias may extend from the resistive element to the lower ILD layer, and a distance between the top plate and the lower inter-level dielectric layer may be at least substantially equal to a height of each via of the plurality of vias.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1A:
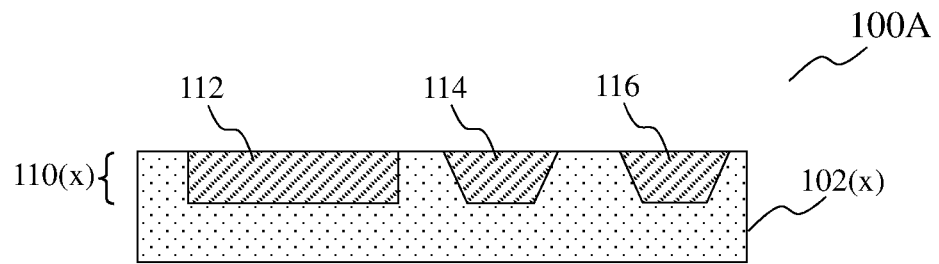
FIGS. 1A to 1L show simplified cross-sectional views that illustrate a method of forming an integrated circuit according to various embodiments.

Embodiments described below in context of the integrated circuits are analogously valid for the respective methods, and vice versa. Furthermore, it will be understood that the embodiments described below may be combined, for example, a part of one embodiment may be combined with a part of another embodiment.

It will be understood that any property described herein for a specific integrated circuit may also hold for any integrated circuit described herein. It will be understood that any property described herein for a specific method may also hold for any method described herein. Furthermore, it will be understood that for any integrated circuit or method described herein, not necessarily all the components or steps described must be enclosed in the device or method, but only some (but not all) components or steps may be enclosed.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

The term "coupled" (or "connected") herein may be understood as electrically coupled or as mechanically coupled, for example attached or fixed, or just in contact without any fixation, and it will be understood that both direct coupling or indirect coupling (in other words: coupling without direct contact) may be provided.

In order that the invention may be readily understood and put into practical effect, various embodiments will now be described by way of examples and not limitations, and with reference to the figures.

According to various embodiments, a method of forming an integrated circuit may be provided. The method may include forming a capacitor and a resistor together in the same fabrication process flow. In other words, the method may include an integrated process flow that simultaneously forms the capacitor and the resistor. As a result, multiple devices may be integrated on a single semiconductor chip in a cost-effective and efficient process. The capacitor may be a MIM capacitor. The resistor may be a TFR. The TFR may be a bottom connection TFR, in other words, the TFR may be physically and electrically coupled to bottom vias located at an underside of the TFR. The bottom vias may couple the TFR to interconnects in a lower ILD layer under the TFR. Separate through vias may couple the interconnects in the lower ILD layer to further interconnects in an upper ILD layer arranged above the TFR, for connecting to external devices. There may be an absence of electrical conductor between an upper side of the TFR and the upper ILD layer. The MIM capacitor may include a top plate that is coupled to an interconnect in the upper ILD layer, and a bottom plate that is coupled to an interconnect in the lower ILD layer.

According to various embodiments, the method may further include forming a metal resistor, for example, a thin film resistor. The metal resistor may be a top connection resistor, in other words, the metal resistor may be physically and electrically coupled to interconnects in the upper ILD layer, for connecting to external devices. There may be an absence of electrical conductor between an underside of the metal resistor and the lower ILD layer.

FIGS. 1A to 1L show simplified cross-sectional views that illustrate a method of forming an integrated circuit 150 according to various embodiments. The integrated circuit 150 may be formed on a semiconductor wafer.

FIG. 1A shows a process 100A. The process 100A may include forming a lower inter-level dielectric (ILD) layer 102(x), where "x" denotes the level number of the layer. The lower ILD layer 102(x), also referred herein as the first ILD layer, may include a dielectric material, such as tetraethoxysilane (TEOS). The process 100A may include forming a bottom metallization layer 110(x), also referred herein as the first metallization layer, within the lower ILD layer 102(x). The bottom metallization layer 110(x) may include a plurality of bottom interconnect members. The bottom interconnect members may also be referred herein as bottom metal interconnects, or bottom metal interconnect members. The plurality of bottom interconnect members may include a bottom plate 112. In other words, one of the bottom interconnect members may be configured as the bottom plate 112. The bottom plate 112 may also be referred herein as a capacitor bottom plate. The plurality of bottom interconnect members may further include a first bottom interconnect member 114 and a second bottom interconnect member 116. Forming the bottom metallization layer 110(x) may include depositing a conductive metal such as copper, over the lower ILD layer 102(x), patterning and etching the deposited conductive metal, and then depositing more of the dielectric material to fill up gaps in the bottom metallization layer 110(x). The process 100A may also include planarizing the lower ILD layer 102(x) and the bottom metallization layer 110(x), to obtain a smooth and planar surface that exposes the bottom metallization layer 110(x).

Figure 1B:
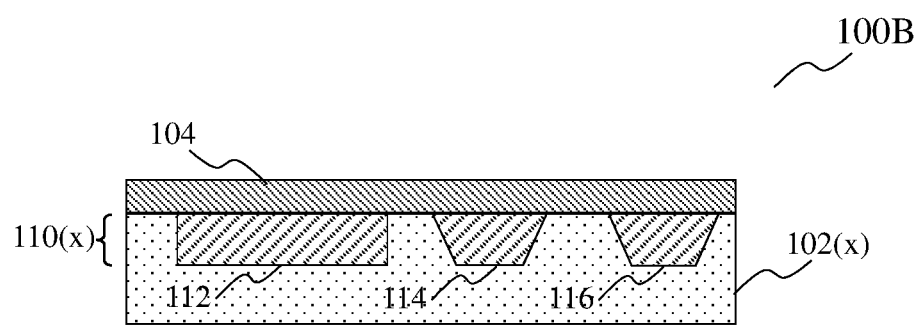

FIG. 1B shows a process 100B. The process 100B may include forming an interlayer 104 over the semiconductor structure resulting from the process 100A. Forming the interlayer 104 may include depositing an interlayer material over the bottom metallization layer 110(x) and the lower ILD layer 102(x). The interlayer material may be selected from materials that may be suitable to function as both an electrical insulator and as a capacitor dielectric. The interlayer material may include, for example, silicon nitride.

Figure 1C:
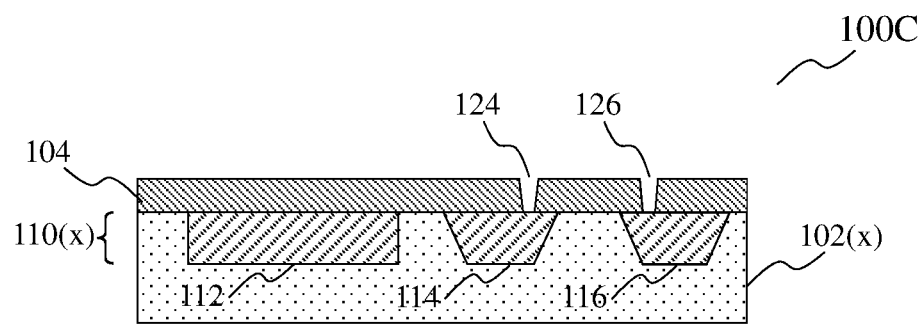

FIG. 1C shows a process 100C. The process 100C may include etching the interlayer 104 to form a plurality of via openings, for example, 124, 126. A first via opening 124 may extend to the first bottom interconnect member 114. A second via opening 126 may extend to the second bottom interconnect member 116.

Figure 1D:
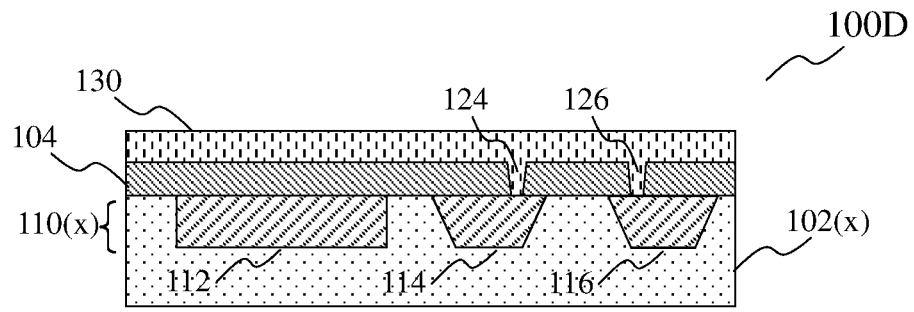

FIG. 1D shows a process 100D. The process 100D may include depositing a metallic material 130 over the interlayer 104. The metallic material 130 may fill up the plurality of via openings 124, 126, to form a respective plurality of bottom vias, for example 134, 136. The first bottom via 134 may provide an electrical connection to the first bottom interconnect member 114. The second bottom via 136 may provide an electrical connection to the second bottom interconnect member 116. The metallic material 130 may include tantalum nitride (TaN), tantalum (Ta), titanium nitride (TiN), titanium (Ti), or combinations thereof.

Figure 1E:
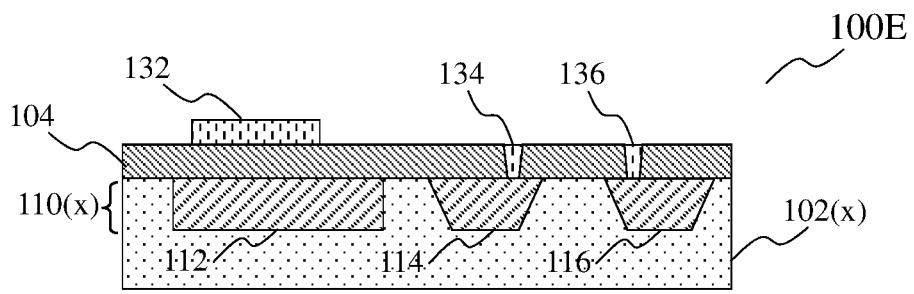

FIG. 1E shows a process 100E. The process 100E may include etching the metallic material 130 to form a top plate 132, also referred herein as a capacitor top plate. The top plate 132 may be at least partially aligned with the bottom plate 112. In other words, the top plate 132 may at least partially overlap the bottom plate 112, while being separated from the bottom plate 112 by the interlayer 104. The interlayer material that lies between the top plate 132 and the bottom plate 112 may form a capacitor dielectric. The process 100E may also include removing the metallic material 130 disposed over the bottom vias 134, 136, such that a top surface of the bottom vias 134 and 136 is now exposed.

Figure 1F:
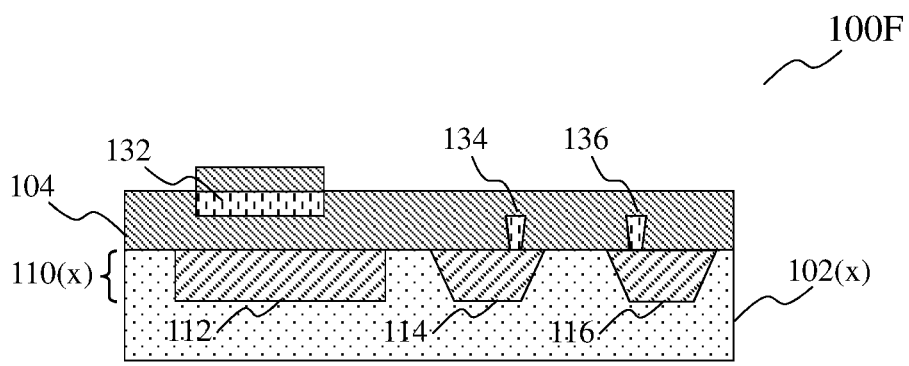

FIG. 1F shows a process 100F. The process 100F may include depositing more of the interlayer material over the semiconductor structure resulting from the process 100E. The interlayer material may cover the top plate 132, as well as the bottom vias 134 and 136. As a result, a thickness of the interlayer 104 may be increased. The top plate 132, the bottom vias 134 and 136, may be buried within the interlayer 104.

Figure 1G:
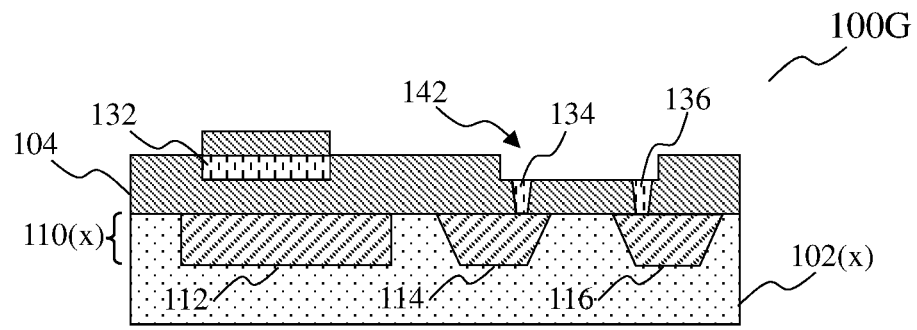

FIG. 1G shows a process 100G. The process 100G may include forming an opening 142 in the interlayer 104, over the bottom vias 134 and 136, so that a top surface of the bottom vias 134 and 136 are exposed.

Figure 1H:
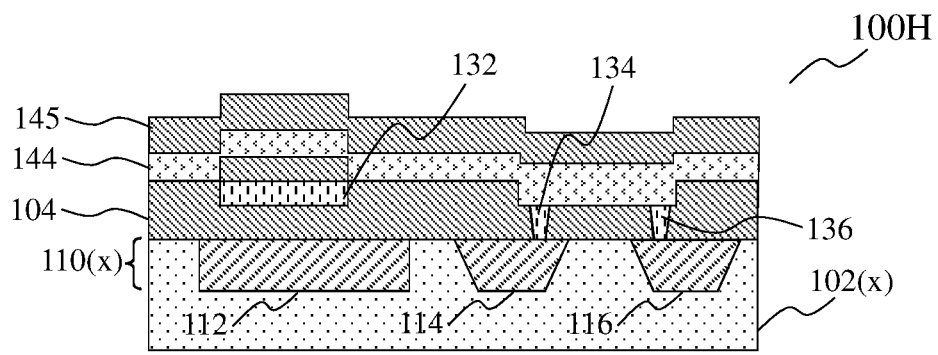

FIG. 1H shows a process 100H. The process 100H may include depositing a resistive material 144 over the interlayer 104. The resistive material 144 may fill the opening 142. The resistive material 144 may include silicon chromium (SiCr), nickel chromium (NiCr), SiCCR, TaSiN, or combinations thereof. The process 100H may further include depositing a cap layer 145 over the resistive material 144. The cap layer may include a dielectric material, such as SiN, SiCN, other suitable materials, or combinations thereof.

Figure 1I:
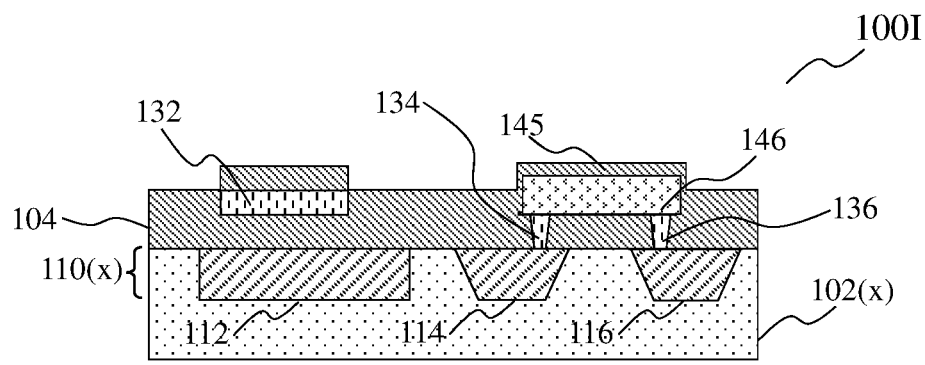

FIG. 1I shows a process 100I. The process 100I may include forming a thin film resistor (TFR) 146. The process 100I may include removing a portion of the resistive material 144 by etching, such that only a thin film of the resistive material 144 remains. The thin film of the resistive material may be the TFR 146. The TFR 146 may be at least partially disposed within the opening 142. The TFR 146 may be disposed directly above, and in contact with, each of the bottom vias 134 and 136. The TFR 146 may be electrically connected to the bottom interconnect members 114 and 116 through the bottom vias 134 and 136, respectively. The process 100I may also include removing most of the cap layer 145 such that only a region of the cap layer 145 that directly overlaps the TFR 146 remains. The cap layer 145 may protect the TFR 146 from being etched away during the process 100I.

Figure 1J:
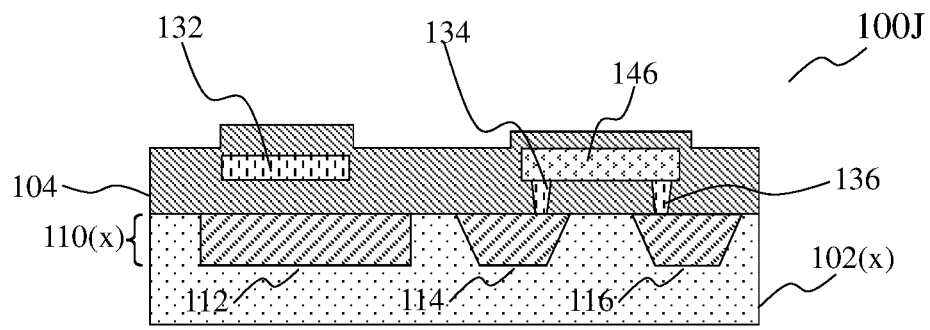

FIG. 1J shows a process 100J. The process 100J may include depositing more of the interlayer material onto the semiconductor structure resulting from the process 100I. The interlayer material may be deposited over the TFR 146 and the cap layer 145 to enclose the TFR 146 within the interlayer 104. The TFR 146 may be at least substantially surrounded by the interlayer material. The interlayer material may electrically insulate the TFR 146.

Figure 1K:
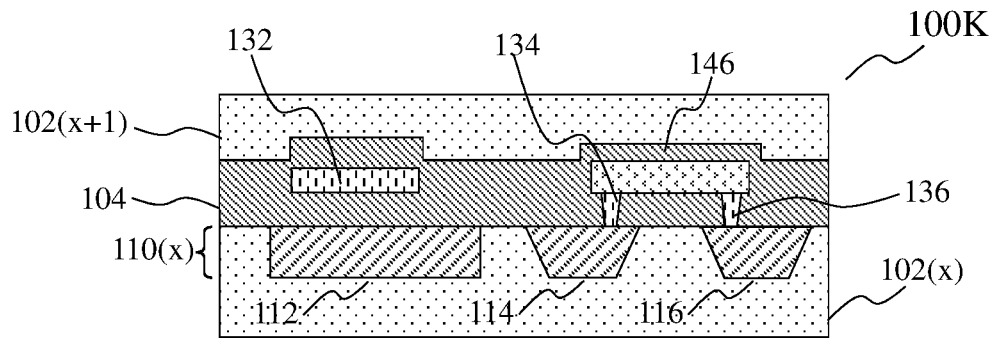

FIG. 1K shows a process 100K. The process 100K may include forming an upper ILD layer 102($x$+1) over the semiconductor structure resulting from the process 100J. The process 100K may include depositing a second dielectric material over the interlayer 104, to form the upper ILD layer 102($x$+1). Alternatively, the upper ILD layer 102($x$+1) may be formed of a different material from the lower ILD layer 102($x$). For example, the upper ILD layer 102($x$+1) may be formed using spin-on-glass (SOG).

Figure 1L:
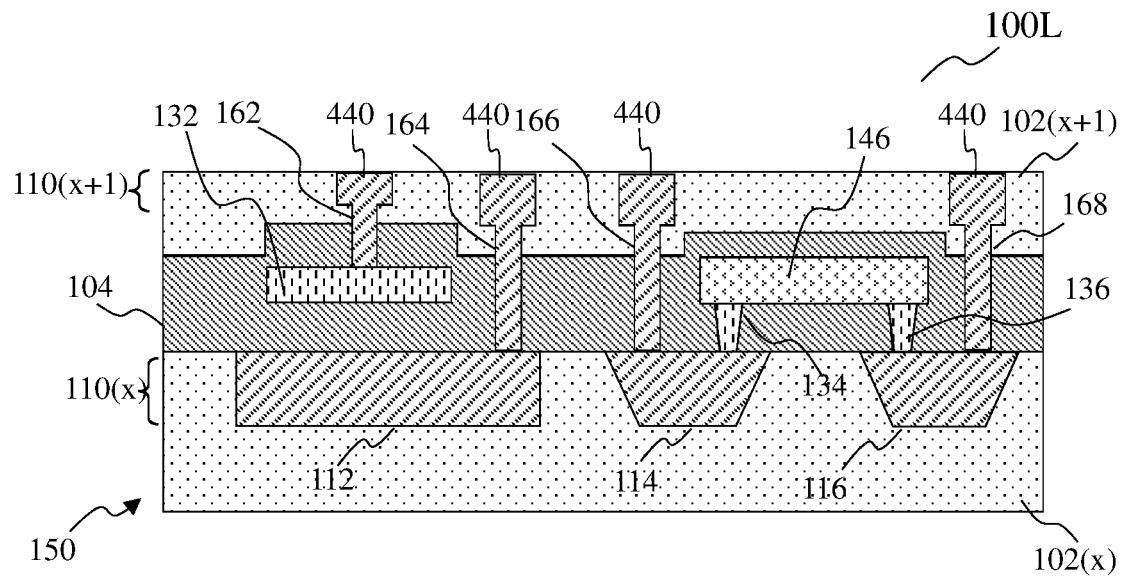

FIG. 1L shows a process 100L. FIG. 1L also shows the cross-sectional view of the integrated circuit 150 according to various embodiments. The process 100L may include forming a top metallization layer 110($x$+1), also referred herein as a second metallization layer, in the upper ILD layer 102($x$+1). The top metallization layer 110($x$+1) may include a plurality of top interconnect members 440. The top interconnect members 440 may also be referred herein as top metal interconnect members or top metal interconnects. The process 100L may also include forming a plurality of vias that connect the top metallization layer 110($x$+1) to devices within the semiconductor structure. The plurality of vias may include a capacitor top via 162 that connects to the top plate 132. The plurality of vias may include a capacitor bottom via 164 that connects to the bottom plate 112. The plurality of vias may include a first resistor via 166 that connects to the first bottom interconnect member 114, and a second resistor via 168 that connects to the second bottom interconnect member 116. The first resistor via 166 may connect the top metallization layer 110($x$+1) to the TFR 146 through the first bottom interconnect member 114 and the first bottom via 134. The second resistor via 168 may connect the top metallization layer 110($x$+1) to the TFR 146 through the second bottom interconnect member 116 and the bottom vias 136.

FIGS. 2A to 2L show simplified cross-sectional views that illustrate a method of forming an integrated circuit 250 according to various embodiments. The integrated circuit 250 may be formed on a semiconductor wafer.

Figure 2A:
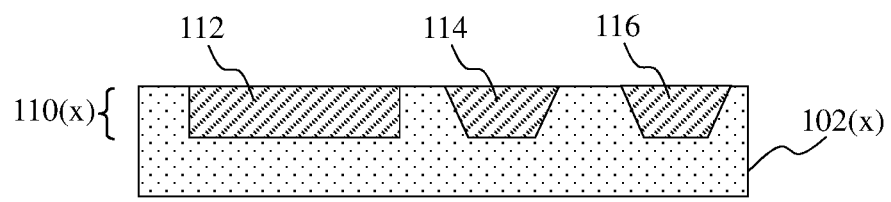
FIGS. 2A to 2L show simplified cross-sectional views that illustrate a method of forming an integrated circuit according to various embodiments.
Figure 2B:
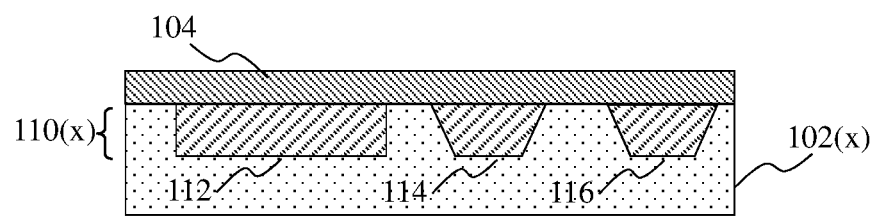

Referring to FIGS. 2A to 2B, the processes shown therein are similar to the processes shown in FIGS. 1A to 1B, and therefore description is omitted for brevity.

Figure 2C:
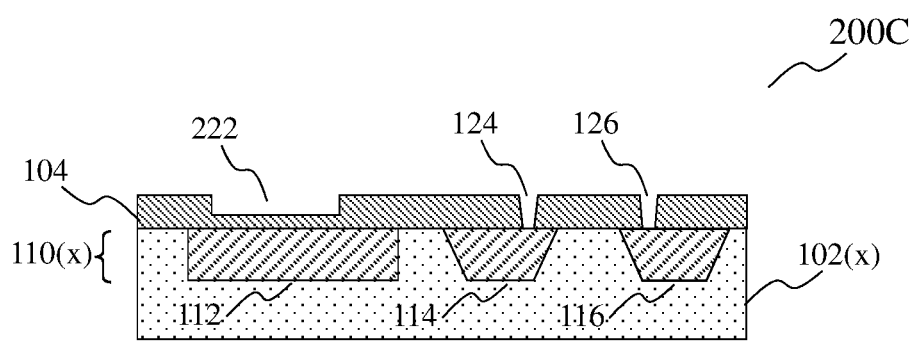

FIG. 2C shows a process 200C. The process 200C may include etching the interlayer 104 to form a plurality of via openings, for example, 124, 126. A first via opening 124 may extend to the first bottom interconnect member 114. A second via opening 126 may extend to the second bottom interconnect member 116. The process 200C may also include etching the interlayer 104 to form a cavity 222 over the bottom plate 112. The cavity 222 may be narrower in width than the bottom plate 112, such that it only partially overlaps the bottom plate 112. The depth of the cavity 222 may be less than the depth of the interlayer 104 such that the cavity 222 does not extend to the bottom plate 112.

Figure 2D:
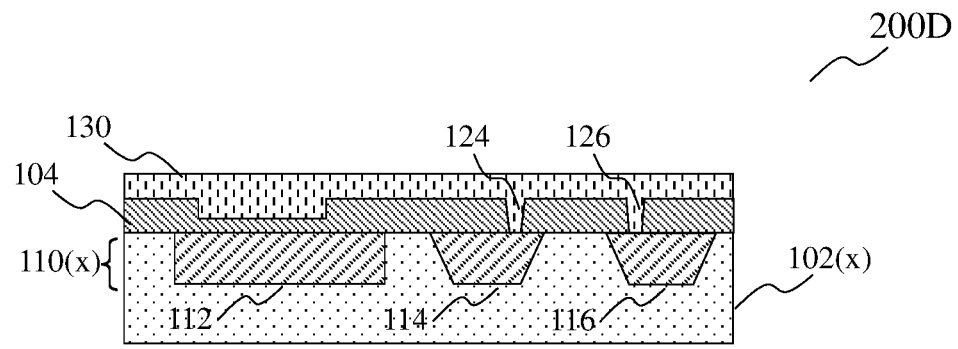

FIG. 2D shows a process 200D. The process 200D may include depositing a metallic material 130 over the interlayer 104. The metallic material 130 may fill up the plurality of via openings 124, 126, to form a respective plurality of bottom vias, for example 134, 136. The first bottom via 134 may provide an electrical connection to the first bottom interconnect member 114. The second bottom via 136 may provide an electrical connection to the second bottom interconnect member 116. The metallic material 130 may include tantalum nitride (TaN), tantalum (Ta), titanium nitride (TiN), titanium (Ti), or combinations thereof. The metallic material 130 may also fill up the cavity 222.

Figure 2E:
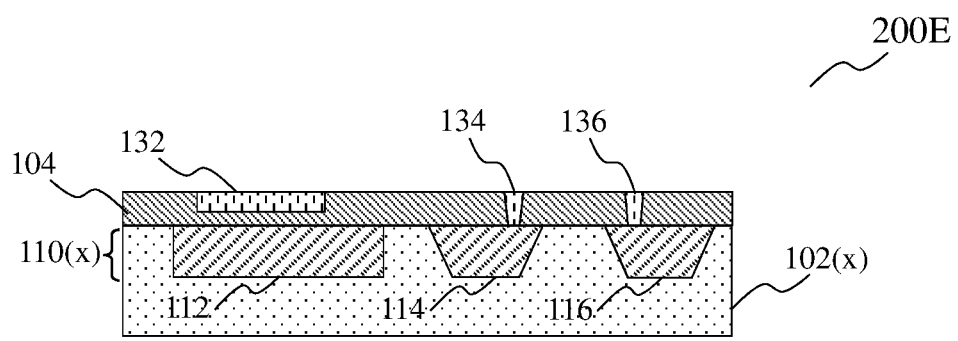

FIG. 2E shows a process 200E. The process 200E may include planarizing the semiconductor structure resulting from the process 200D. The planarization process may be performed using chemical mechanical planarization (CMP). As a result, the metallic material 130 may be mostly removed, leaving behind only the metallic material that fills up the cavity 222 and the metallic material that fills up the bottom vias 134, 136. The metallic material that fills up the cavity 222 may form a top plate 132. The planarization process may produce a smooth surface over the interlayer 104, that exposes a top surface of the bottom vias 134 and 136, as well as the top plate 132.

Figure 2F:
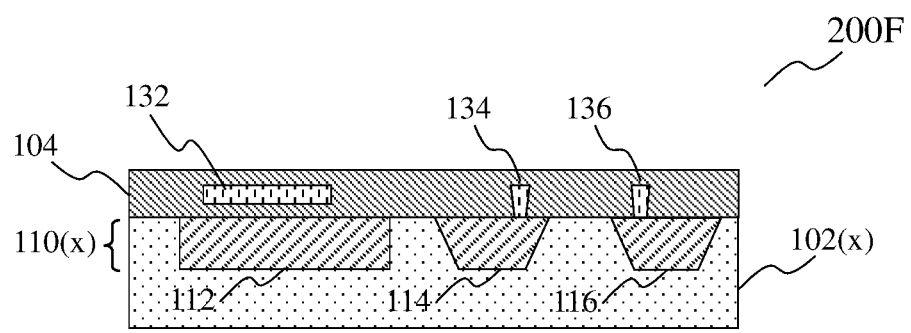

FIG. 2F shows a process 200F. The process 200F may include depositing more of the interlayer material over the semiconductor structure resulting from the process 200E. The interlayer material may cover the top plate 132, as well as the bottom vias 134 and 136. As a result, a thickness of the interlayer 104 may be increased. The top plate 132, the bottom vias 134 and 136, may be buried within the interlayer 104.

Figure 2G:
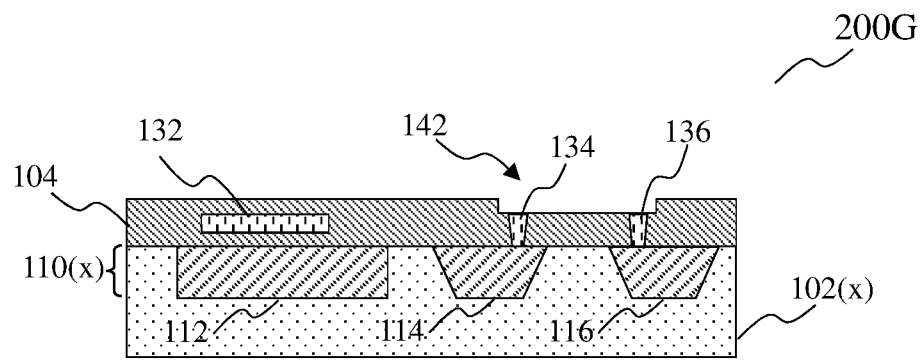

FIG. 2G shows a process 200G. The process 200G may include forming an opening 142 in the interlayer 104, over the bottom vias 134 and 136, so that a top surface of the bottom vias 134 and 136 are exposed.

Figure 2H:
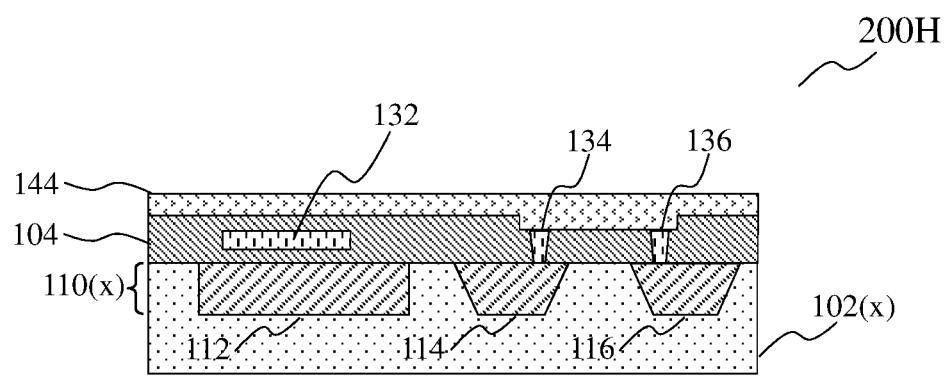

FIG. 2H shows a process 200H. The process 200H may include depositing a resistive material 144 over the interlayer 104. The resistive material 144 may fill the opening 142. The resistive material may include silicon chromium (SiCr), nickel chromium (NiCr), SiCCR, TaSiN, doped polysilicon, or combinations thereof.

Figure 2I:
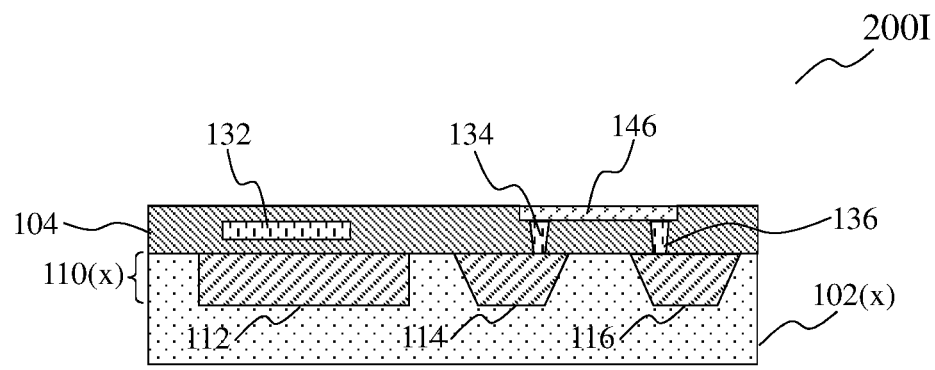

FIG. 2I shows a process 200I. The process 200I may include forming a thin film resistor (TFR) 146. The process 200I may include planarizing the semiconductor structure resulting from the process 200H, for example, by CMP. The planarization process may remove part of the resistive material 144 such that only a thin film of the resistive material 144 that filled the opening 142 remains. The thin film of the resistive material may be the TFR 146. The TFR 146 may be disposed directly above, and in contact with, each of the bottom vias 134 and 136. The TFR 146 may be electrically connected to the bottom interconnect members 114 and 116 through the bottom vias 134 and 136, respectively.

Figure 2J:
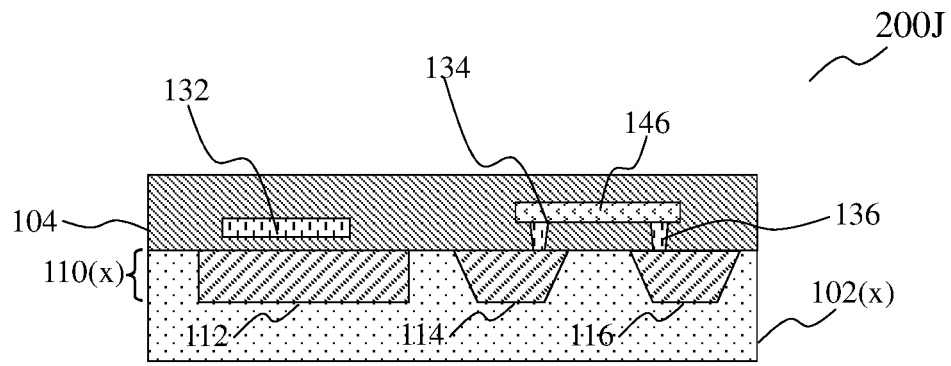

FIG. 2J shows a process 200J. The process 200J may include depositing more of the interlayer material onto the semiconductor structure resulting from the process 100I. The interlayer material may be deposited over the TFR 146 to enclose the TFR 146 within the interlayer 104. The TFR 146 may be at least substantially surrounded by the interlayer material. The interlayer material may electrically insulate the TFR 146.

Figure 2K:
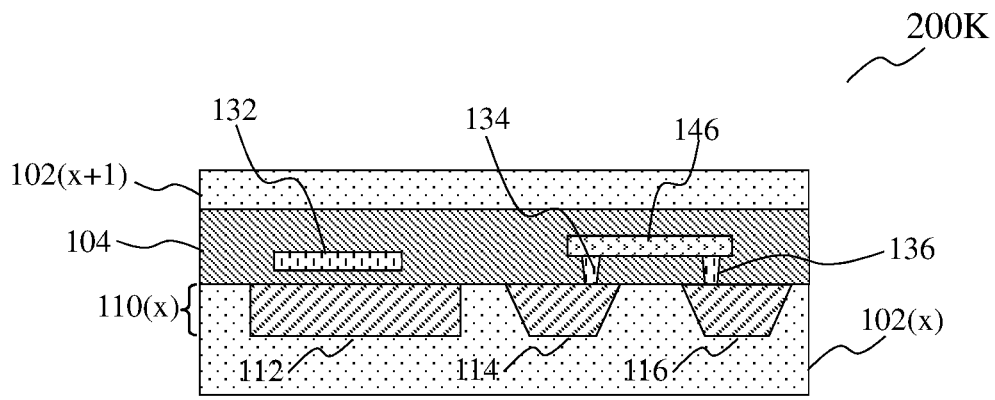

FIG. 2K shows a process 200K. The process 200K may include forming an upper ILD layer 102($x$+1) over the semiconductor structure resulting from the process 100J. The process 200K may include depositing a second dielectric material over the interlayer 104, to form the upper ILD layer 102($x$+1). Alternatively, the upper ILD layer 102($x$+1) may be formed of a different material from the lower ILD layer 102(x). For example, the upper ILD layer 102(x+1) may be formed using spin-on-glass (SOG).

Figure 2L:
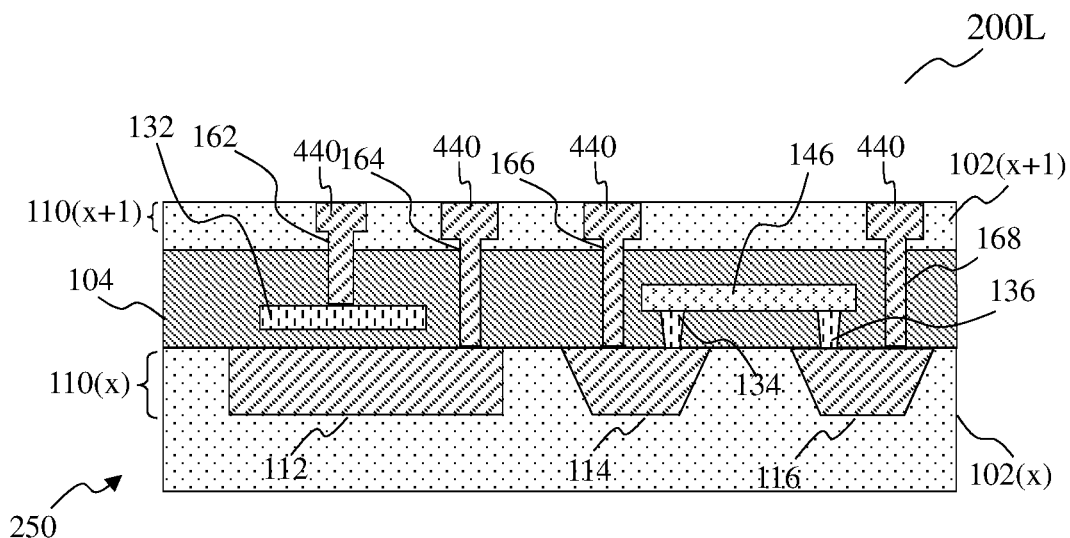

FIG. 2L shows a process 200L. FIG. 2L also shows the cross-sectional view of the integrated circuit 250 according to various embodiments. The process 200L may include forming a top metallization layer 110(x+1) in the upper ILD layer 102(x+1). The top metallization layer 110(x+1) may include a plurality of top interconnect members 440. The process 100L may also include forming a plurality of vias that connect the top metallization layer 110(x+1) to devices within the semiconductor structure. The plurality of vias may include a capacitor top via 162 that connects to the top plate 132. The plurality of vias may include a capacitor bottom via 164 that connects to the bottom plate 112. The plurality of vias may include a first resistor via 166 that connects to the first bottom interconnect member 114, and a second resistor via 168 that connects to the second bottom interconnect member 116. The first resistor via 166 may connect the top metallization layer 110(x+1) to the TFR 146 through the first bottom interconnect member 114 and the first bottom via 134. The second resistor via 168 may connect the top metallization layer 110(x+1) to the TFR 146 through the second bottom interconnect member 116 and the bottom vias 136.

FIGS. 3A to 3L show simplified cross-sectional views that illustrate a method of forming an integrated circuit 350 according to various embodiments. The integrated circuit 350 may be formed on a semiconductor wafer.

Referring to FIGS. 3A to 3E, the processes shown therein are similar to the processes shown in FIGS. 1A to 1E, and therefore description is omitted for brevity.

Figure 3A:
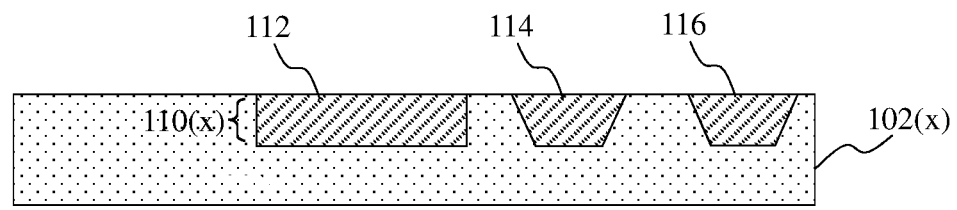
FIGS. 3A to 3L show simplified cross-sectional views that illustrate a method of forming an integrated circuit according to various embodiments.
Figure 3B:
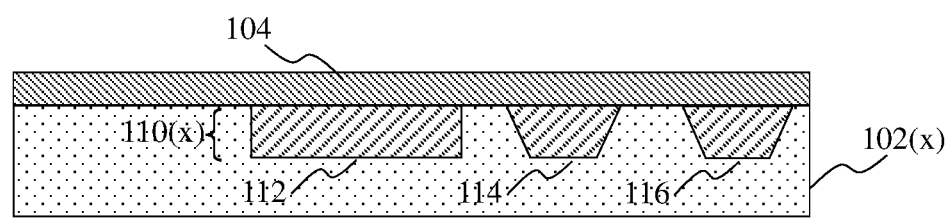
Figure 3C:
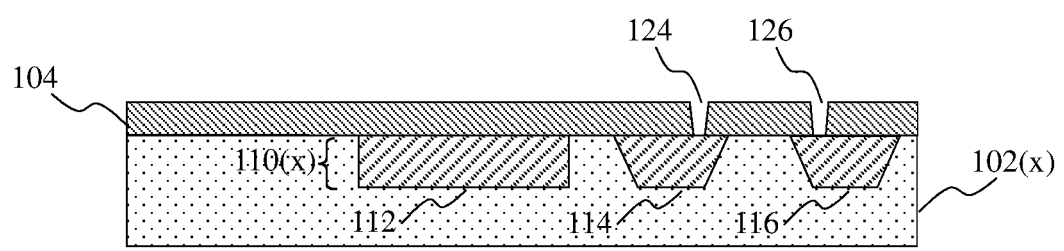
Figure 3D:
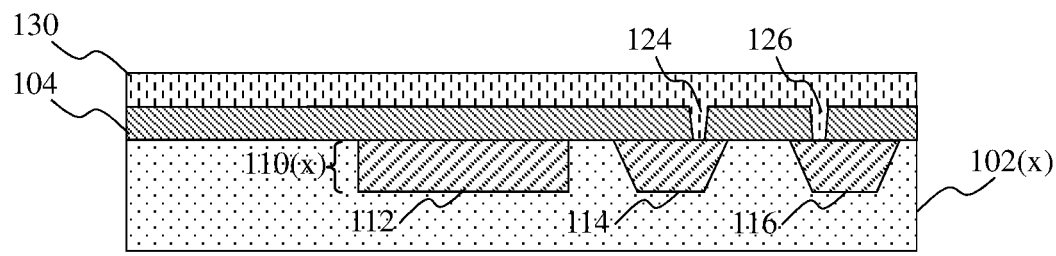
Figure 3E:
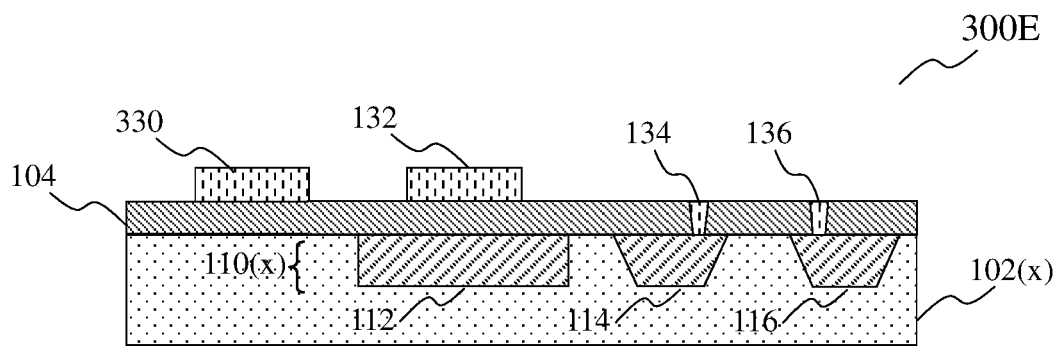

FIG. 3E shows a process 300E. The process 300E may include etching the metallic material 130 to form a top plate 132 and a metallic resistor 330. The top plate 132 may be at least partially aligned to overlap the bottom plate 112. The metallic resistor 330 may be laterally offset from each of the bottom plate 112, the first bottom via 134 and the second bottom via 136. The process 300E may also include removing the metallic material 130 disposed over the bottom vias 134, 136, such that a top surface of the bottom vias 134 and 136 is now exposed.

Figure 3F:
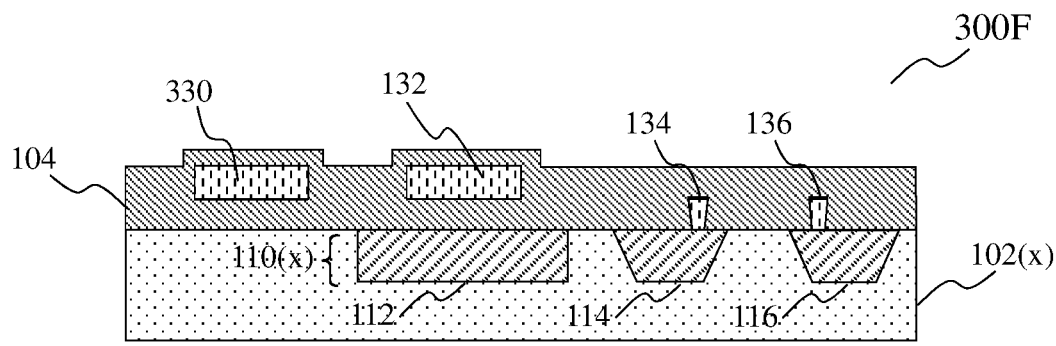

FIG. 3F shows a process 300F. The process 300F may include depositing more of the interlayer material over the semiconductor structure resulting from the process 300E. The interlayer material may cover the top plate 132, the metallic resistor 330, as well as the bottom vias 134 and 136. As a result, a thickness of the interlayer 104 may be increased. Each of the top plate 132, the metallic resistor 330, the first bottom via 134 and the second bottom via 136, may be buried within the interlayer 104.

Figure 3G:
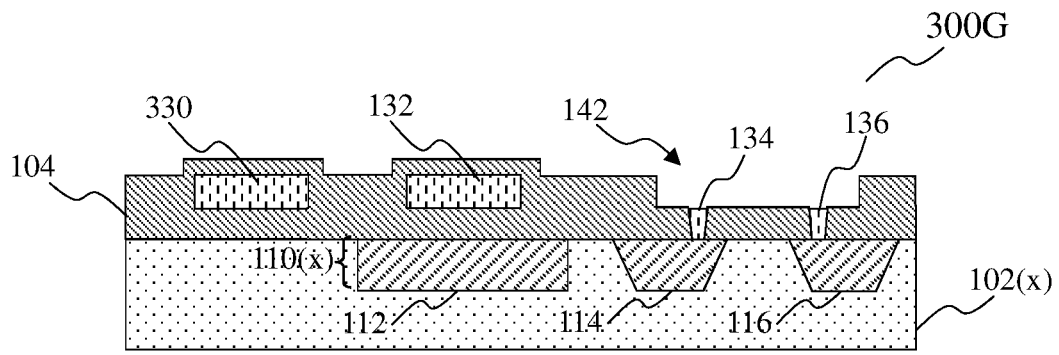

FIG. 3G shows a process 300G. The process 300G may include forming an opening 142 in the interlayer 104 of the semiconductor structure resulting from the process 300F. The opening 142 may be formed over the bottom vias 134 and 136, so that a top surface of the bottom vias 134 and 136 are exposed.

Figure 3H:
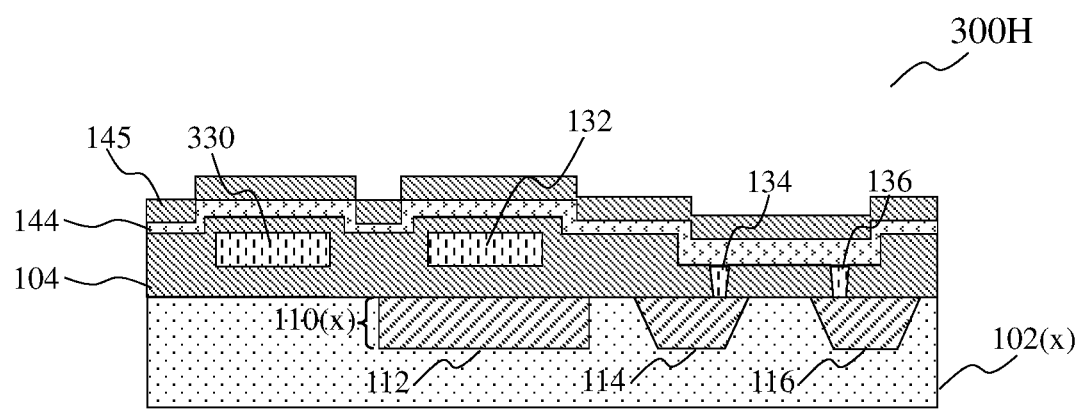

FIG. 3H shows a process 300H. The process 300H may include depositing a resistive material 144 over the interlayer 104 of the semiconductor structure resulting from the process 300G. The resistive material 144 may line the entire exposed surface of the semiconductor structure resulting from the process 300G. The resistive material 144 may also fill the opening 142. The process 300H may also include depositing a cap layer 145 over the resistive material 144. The cap layer 145 may protect a region of the resistive material 144 that will form a thin film resistor, from being etched away in a subsequent process 300I.

Figure 3I:
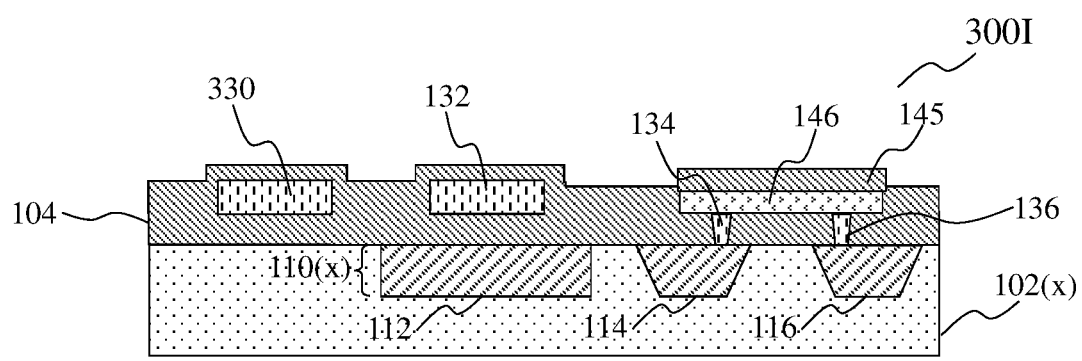

FIG. 3I shows the process 300I. The process 300I may include forming a thin film resistor (TFR) 146. The process 300I may include removing the resistive material 144 by etching, such that only a thin film of the resistive material 144 remains in the opening 142. The thin film of the resistive material that remains may form the TFR 146. The TFR 146 may be disposed directly above, and in contact with, each of the bottom vias 134 and 136. The TFR 146 may be electrically connected to the bottom interconnect members 114 and 116 through the bottom vias 134 and 136, respectively. The process 300I may include removing most of the cap layer 145, for example, by etching. After most of the cap layer 145 is removed, the remaining cap layer 145 is a region that covers the TFR 146.

Figure 3J:
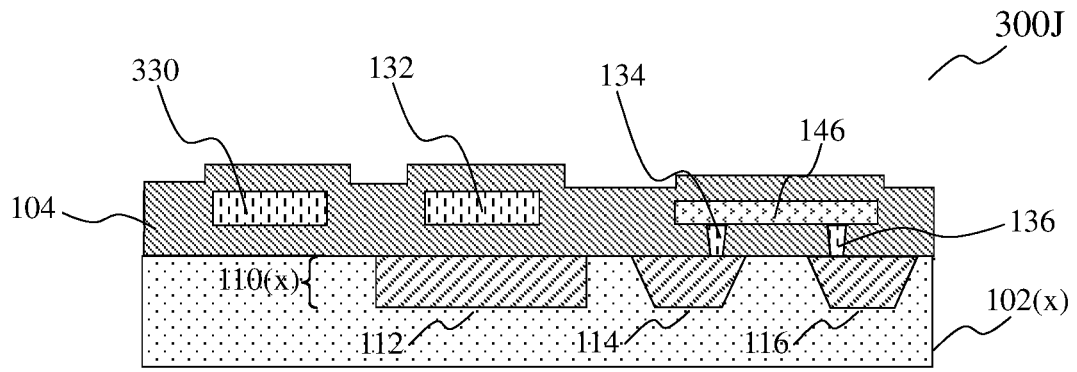

FIG. 3J shows a process 300J. The process 300J may include depositing more of the interlayer material onto the semiconductor structure resulting from the process 300I. The interlayer material may be deposited over the TFR 146 and the cap layer 145 to enclose the TFR 146 within the interlayer 104. The TFR 146 may be at least substantially surrounded by the interlayer material. The interlayer material may electrically insulate the TFR 146.

Figure 3K:
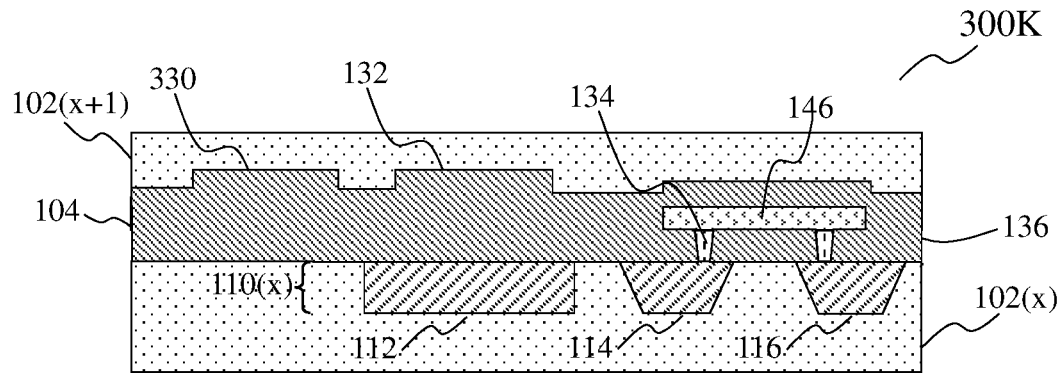

FIG. 3K shows a process 300K. The process 300K may include forming an upper ILD layer 102(x+1) over the semiconductor structure resulting from the process 300J. The process 300K may include depositing a second dielectric material over the interlayer 104, to form the upper ILD layer 102(x+1). Alternatively, the upper ILD layer 102(x+1) may be formed of a different material from the lower ILD layer 102(x).

Figure 3L:
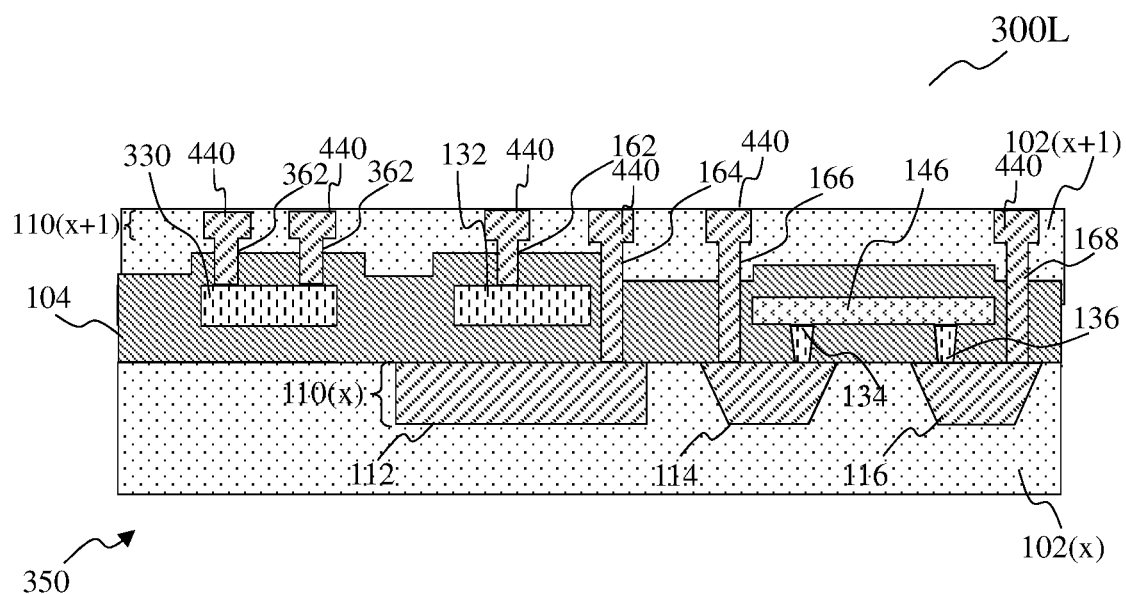

FIG. 3L shows a process 300L. FIG. 3L also shows the cross-sectional view of the integrated circuit 350 according to various embodiments. The process 300L may include forming a top metallization layer 110(x+1) in the upper ILD layer 102(x+1). The top metallization layer 110(x+1) may include a plurality of top interconnect members 440. The process 300L may also include forming a plurality of vias that connect the top metallization layer 110(x+1) to devices within the semiconductor structure resulting from the process 300K. The plurality of vias may include a plurality of resistor top vias 362. The resistor top vias 362 may extend from the upper ILD layer 102(x+1) into the interlayer 104, to contact the metallic resistor 330. The plurality of vias may also include a capacitor top via 162 that connects to the top plate 132. The plurality of vias may include a capacitor bottom via 164 that connects to the bottom plate 112. The plurality of vias may include a first resistor via 166 that connects to the first bottom interconnect member 114, and a second resistor via 168 that connects to the second bottom interconnect member 116. The first resistor via 166 may connect the top metallization layer 110(x+1) to the TFR 146 through the first bottom interconnect member 114 and the first bottom via 134. The second resistor via 168 may connect the top metallization layer 110(x+1) to the TFR 146 through the second bottom interconnect member 116 and the bottom vias 136.

Figure 4A:
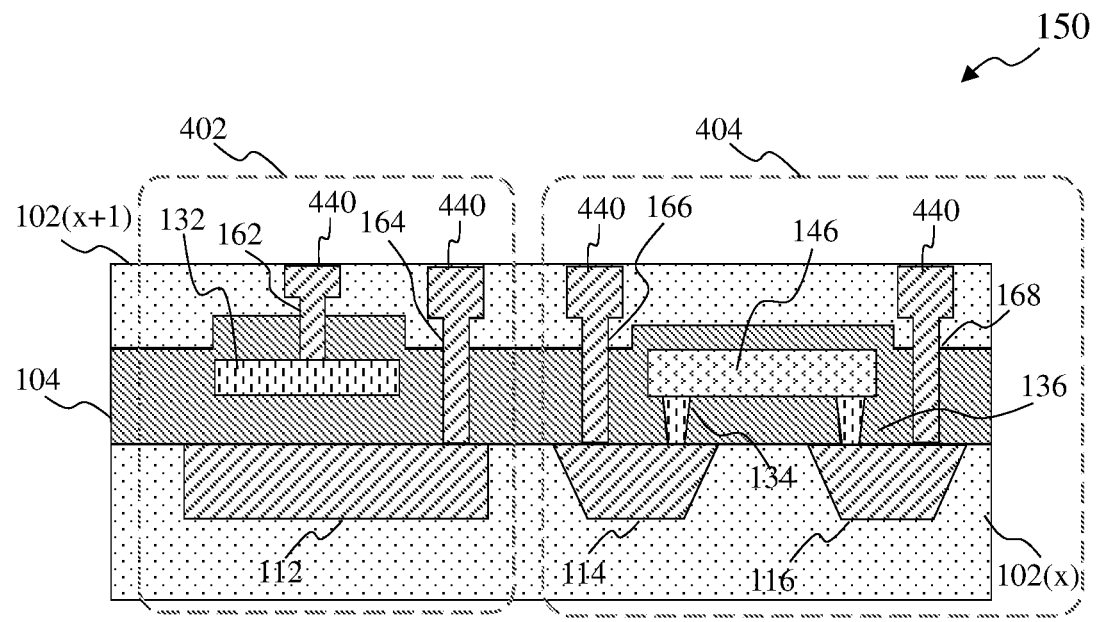
FIG. 4A shows the cross-sectional view of the integrated circuit of FIG. 1L.
Figure 4B:
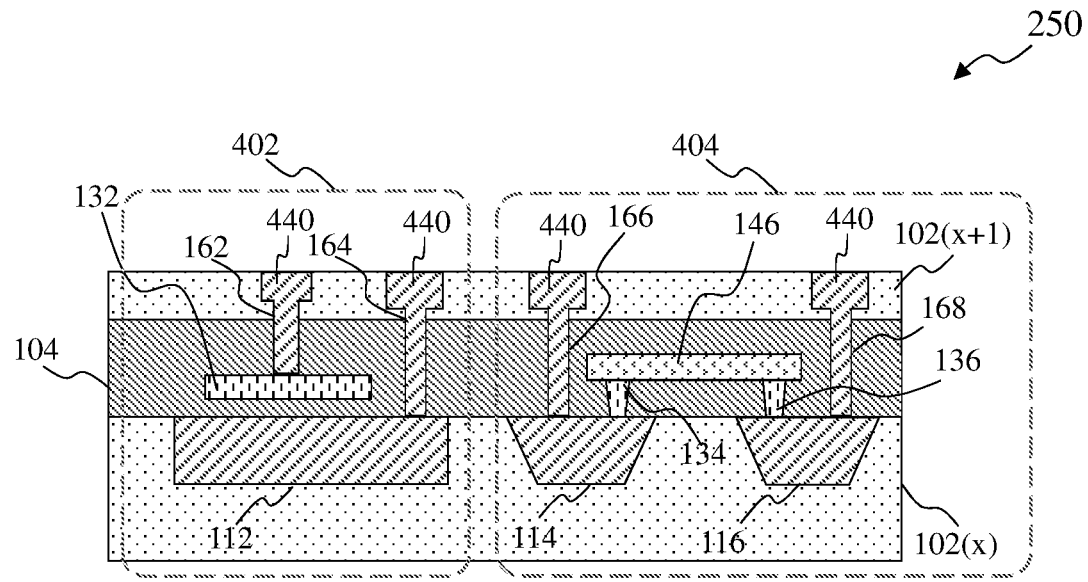
FIG. 4B shows the cross-sectional view of the integrated circuit of FIG. 2L.
Figure 4C:
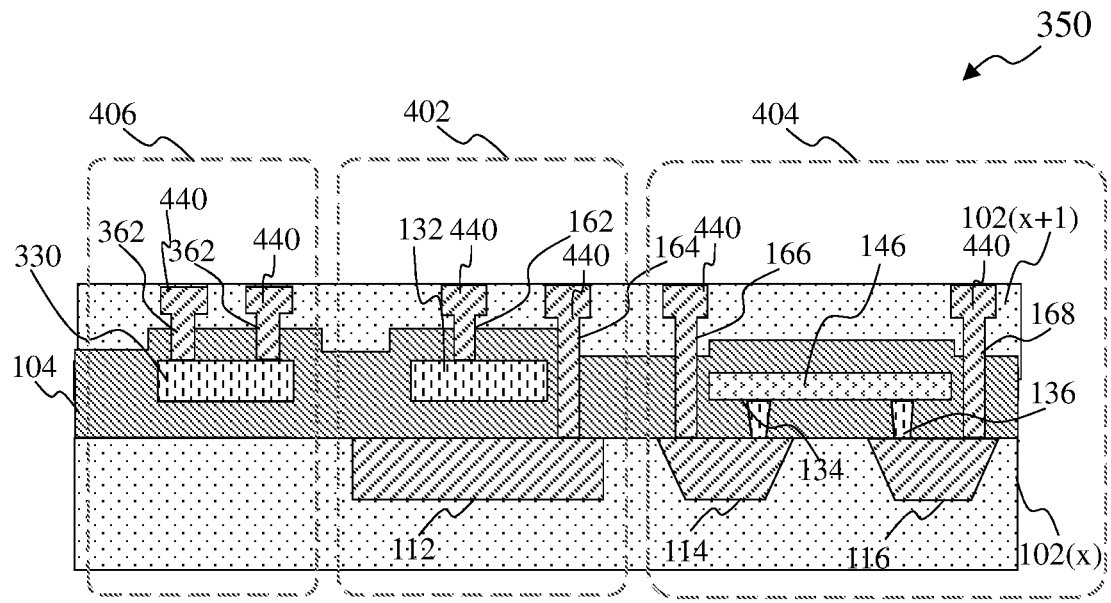
FIG. 4C shows the cross-sectional view of the integrated circuit of FIG. 3L.

FIGS. 4A to 4C show the cross-sectional views of each of the integrated circuits 150, 250, and 350. The cross-sectional views of the integrated circuits 150, 250 and 350 correspond to FIGS. 1L, 2L and 3L respectively.

Referring to FIG. 4A, the integrated circuit 150 may include a capacitor device 402 and a resistor device 404 formed on a single wafer chip. The integrated circuit 150 may include the upper ILD layer 102(x+1), the lower ILD layer 102(x) and the interlayer 104. The interlayer 104 may be disposed above the lower ILD layer 102(x) and under the upper ILD layer 102(x+1). The capacitor device 402 may include the top plate 132 and the bottom plate 112, as well as a layer of dielectric material between the top plate 132 and the bottom plate 112. The top plate 132 may be a metallic structure embedded in a first region of the interlayer 104. The bottom plate 112 may be formed as part of the bottom metallization layer in the lower ILD layer 102(x). The bottom metallization layer may include a plurality of bottom metal interconnects. One bottom metal interconnect of the plurality of bottom metal interconnects may be the bottom plate 112. In other words, the bottom plate 112 may be a first bottom metal interconnect of the plurality of bottom metal interconnects. The top plate 132 and the bottom plate 112 may at least partially overlap such that they sandwich a region of the interlayer 104 between them. In other words, the top plate 132 and the bottom plate 112 may be physically separated by a portion of the interlayer 104. The sandwiched region of the interlayer 104, i.e. the portion of the interlayer 104 between the top plate 132 and the bottom plate 112, may function as the capacitor dielectric of the capacitor device 402. The sandwiched region of the interlayer 104 may be a thin film of dielectric material. The top plate 132 may be connected to the top metallization layer in the upper ILD layer 102(x+1) by an electrical connector that may be the capacitor top via 162. The capacitor top via 162 may extend from an upper side of the top plate 132 to the top metallization layer in the upper ILD layer 102(x+1). The top metallization layer may include a plurality of top metal interconnects 440. The capacitor top via 162 may connect a first top metal interconnect to the top plate 132. The upper side of the top plate may face away from the bottom plate. The bottom plate 112 may be connected to the upper ILD layer by an electrical connector that is the capacitor bottom via 164. The capacitor bottom via 164 may extend from an upper side of the bottom plate 112 to the top metallization layer in the upper ILD layer 102(x+1). The interlayer 104 may protrude above the top plate 132, as the top plate 132 may be formed above an at least substantially planar interlayer 104 in the process 100E. The resistor device 404 may include a resistive element that may be the TFR 146. The resistor device 404 may also include the bottom vias 134. The resistive element and the bottom vias 134 may be disposed in a second region of the interlayer 104. The bottom vias 134 may extend from the resistive element to respective bottom metal interconnects in the bottom metallization layer in the lower ILD layer 102(x). The second region may be laterally offset from the first region of the interlayer 104 such that the resistor device 404 is arranged beside the capacitor device 402 instead of being vertically stacked with the capacitor device 402. The resistor device 404 may further include the first resistor via 166 and the second resistor via 168. Each of the first resistor via 166 and the second resistor via 168 may couple the bottom metal interconnects that are coupled to the bottom vias 134, to the top metallization layer in the upper ILD layer 102(x+1).

A surface of the top plate 132 that faces the lower ILD layer 102(x) may be referred herein as a bottom surface of the top plate 132. An opposite surface of the top plate 132 that faces the upper ILD layer 102(x+1) may be referred herein as a top surface of the top plate 132. The distance between the bottom surface of the top plate 132 and the lower ILD layer 102(x) may be at least substantially the same as the height of the bottom vias 134, and also at least substantially the same as the distance between the TFR 146 and the lower ILD layer 102(x). As described with respect to FIGS. 1A to 1L, the capacitor device 402 and the TFR device 404 may be fabricated in the same fabrication process flow. The top plate 132 and the bottom vias 134 may be formed concurrently, through the same fabrication process steps. The method of forming the top plate 132 and the bottom vias 134 simultaneously may include the processes 100C, 100D and 100E.

Referring to FIG. 4B, the integrated circuit 250 may be similar to the integrated circuit 150, in that it also includes the capacitor device 402 and the resistor device 404. The integrated circuit 250 may differ from the integrated circuit 150, in that the interlayer 104 is at least substantially planar across the capacitor device 402. Unlike in the integrated circuit 150, the interlayer 104 does not protrude above the top plate 132. This is a result of the processes 200C, 200D and 200E, where the top plate 132 is formed by filling the cavity 222 in the interlayer 104 with a metallic material and then planarizing the metallic material. Consequently, a distance between the top surface of the top plate 132 and the lower ILD layer 102(x) is at least substantially equal to a height of the bottom vias 134, as well as the distance between the TFR 146 and the lower ILD layer 102(x). The top plate 132 and the bottom vias 134 may be formed concurrently, through the same fabrication process steps. The method of forming the top plate 132 and the bottom vias 134 simultaneously may include the processes 200C, 200D and 200E.

Referring to FIG. 4C, the integrated circuit 350 may be similar to the integrated circuit 150, but may additionally include a further resistor device 406. The further resistor device 406 may include a further resistive element disposed in a third region of the interlayer. The further resistive element may be the metallic resistor 330. The third region of the interlayer may be laterally offset from each of the capacitor device 402 and the resistor device 404. The metallic resistor 330 and the top plate 132 may be identical in material composition. The further resistor device 406 may further include a plurality of resistor top vias 362. The resistor top vias 362 may extend from the metallic resistor 330 to the upper ILD layer 102(x+1). The resistor top vias 362 may connect the metallic resistor 330 to top metal interconnects 440 in the top metallization layer. The interlayer 104 may protrude above the metallic resistor 330. The metallic resistor 330 may be disposed at a same depth in the interlayer as the top plate 132. In other words, a distance between the metallic resistor 330 and the lower ILD layer 102(x) may be at least substantially equal to the distance between the top plate 132 and the lower ILD layer 102(x).

According to various embodiments, the capacitor device 402 may include a MIM capacitor.

According to various embodiments, one or more of the top metallization layer and the bottom metallization layer may include copper.

According to various embodiments, the interlayer 104 may include silicon nitride.

According to various embodiments, the material composition of each of the top plate 132 and the bottom vias 134 may include TaN, Ti, TiN, Ta, or combinations thereof.

Figure 5:
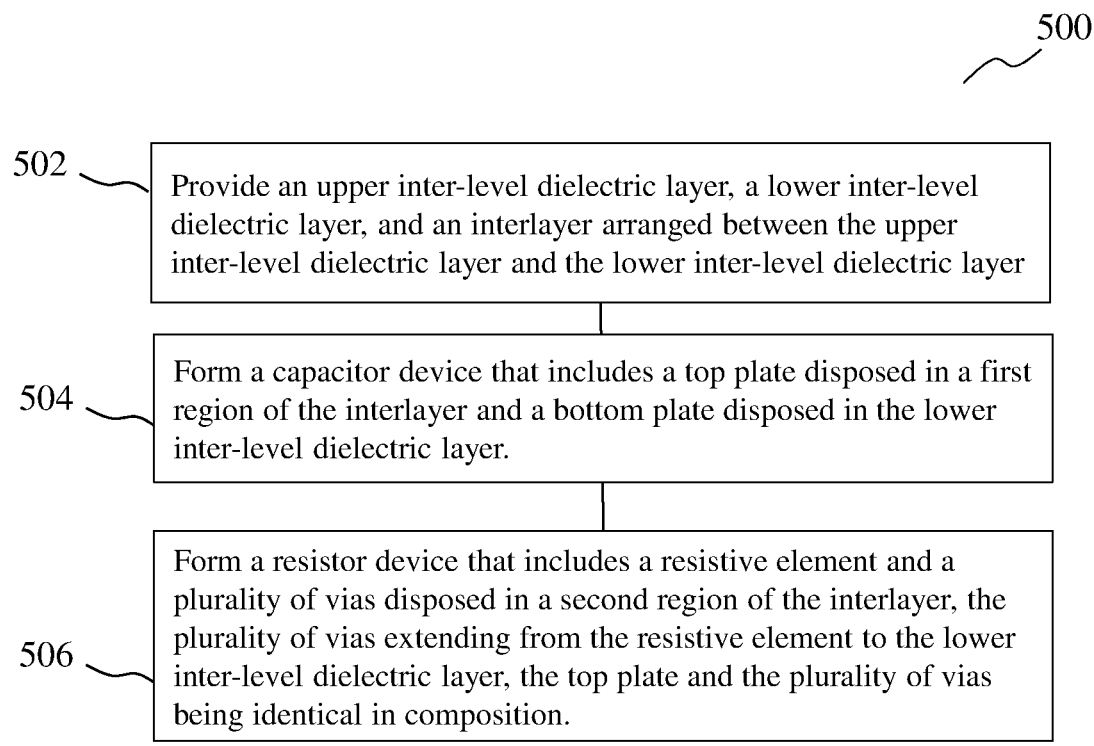
FIG. 5 shows a flow diagram of a method of forming an integrated circuit according to various embodiments.

FIG. 5 shows a flow diagram 500 of a method of forming an integrated circuit according to various embodiments. The method may include providing an upper ILD layer, a lower ILD layer, and an interlayer, in 502. The interlayer may be arranged between the upper ILD layer and the lower ILD layer. The method may include forming a capacitor device in 504. The capacitor device may include a top plate disposed in a first region of the interlayer, and a bottom plate disposed in the lower inter-level dielectric layer. The method may include forming a resistor device, in 506. The resistor device may include a resistive element and a plurality of vias disposed in a second region of the interlayer. The plurality of vias may extend from the resistive element to the lower ILD layer. The top plate and the plurality of vias may be identical in material composition.

According to various embodiments, the method shown in FIG. 5 may further include forming a further resistor device. The further resistor device may include a further resistive element disposed in a third region of the interlayer, and an electrical connector. The further resistive element and the top plate may be identical in material composition. The electrical connector may extend from the further resistive element to the upper ILD layer.

According to various embodiments, the method may include forming the top plate of the capacitor device and a plurality of vias of the resistor device simultaneously. Forming the top plate and the plurality of vias simultaneously may include forming a plurality of via openings in the interlayer, depositing a metallic material over the interlayer and into the plurality of via openings, and etching the deposited metallic material to form the top plate and the plurality of vias. Alternatively, forming the top plate and the plurality of vias simultaneously may include forming a cavity and the plurality of via openings in the interlayer, depositing a metallic material into the cavity and the plurality of via openings, and planarizing the deposited metallic material.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

It will be appreciated to a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The invention claimed is:

1. An integrated circuit comprising:
an upper inter-level dielectric layer;
a lower inter-level dielectric layer;
an interlayer arranged between the upper inter-level dielectric layer and the lower inter-level dielectric layer;
a capacitor device comprising a top plate disposed in a first region of the interlayer, and a bottom plate disposed in the lower inter-level dielectric layer;
a resistor device comprising a resistive element and a plurality of vias disposed in a second region of the interlayer, the plurality of vias extending from the resistive element to the lower inter-level dielectric layer;
wherein the top plate and the plurality of vias are identical in material composition.

2. The integrated circuit of claim 1, wherein a portion of the interlayer lies between the top plate and the bottom plate.

3. The integrated circuit of claim 1, wherein the top plate has a bottom surface facing the lower inter-level dielectric layer, wherein a distance between the bottom surface of the top plate and the lower inter-level dielectric layer is at least substantially equal to a height of each via of the plurality of vias.

4. The integrated circuit of claim 1, wherein the top plate has a top surface facing the upper inter-level dielectric layer, wherein a distance between the top surface of the top plate and the lower inter-level dielectric layer is at least substantially equal to a height of each via of the plurality of vias.

5. The integrated circuit of claim 3, wherein the material composition of each of the top plate and the plurality of vias comprises TaN, Ti, TiN, Ta, or combinations thereof.

6. The integrated circuit of claim 1, wherein the lower inter-level dielectric layer comprises a plurality of bottom metal interconnects.

7. The integrated circuit of claim 6, wherein one bottom metal interconnect of the plurality of bottom metal interconnects is configured as the bottom plate.

8. The integrated circuit of claim 6, wherein each via of the plurality of vias connect the resistive element to a respective bottom metal interconnect of the plurality of bottom metal interconnects.

9. The integrated circuit of claim 1, wherein the upper inter-level dielectric layer comprises a plurality of top metal interconnects, wherein the capacitor device comprises an electrical connector extending from the top plate to a first top metal interconnect of the plurality of top metal interconnects.

10. The integrated circuit of claim 1, wherein the resistive element is a thin film resistor.

11. The integrated circuit of claim 1, wherein the capacitor device comprises a metal-insulator-metal capacitor.

12. The integrated circuit of claim 1, wherein the second region of the interlayer is laterally offset from the first region of the interlayer.

13. The integrated circuit of claim 1, further comprising:
a further resistor device, the further resistor device comprising:
a further resistive element disposed in a third region of the interlayer, the further resistive element being identical in material composition with the top plate, and
an electrical connector extending from the further resistive element to the upper inter-level dielectric layer.

14. The integrated circuit of claim 13, wherein a distance of the further resistive element from the lower inter-level dielectric is at least substantially equal to the distance of a bottom surface of the top plate from the lower inter-level dielectric.

15. The integrated circuit of claim 13, wherein the third region of the interlayer is laterally offset from each of the first region of the interlayer and the second region of the interlayer.

16. The integrated circuit of claim 13, wherein the upper inter-level dielectric layer comprises a plurality of top metal interconnects, wherein the further resistor device comprises an electrical connector extending from the further resistive element to a respective top metal interconnect of the plurality of top metal interconnects.

17. A method of forming an integrated circuit, the method comprising:
providing an upper inter-level dielectric layer, a lower inter-level dielectric layer, and an interlayer arranged between the upper inter-level dielectric layer and the lower inter-level dielectric layer;
forming a capacitor device comprising a top plate disposed in a first region of the interlayer, and a bottom plate disposed in the lower inter-level dielectric layer;
forming a resistor device comprising a resistive element and a plurality of vias disposed in a second region of the interlayer, the a plurality of vias extending from the resistive element to the lower inter-level dielectric layer;
wherein the top plate and the plurality of vias are identical in material composition.

18. The method of claim 17, further comprising:
forming a further resistor device, the further resistor device comprising:
a further resistive element disposed in a third region of the interlayer, a composition of the further resistive element being identical to the composition of the top plate, and
an electrical connector extending from the further resistive element to the upper inter-level dielectric layer.

19. The method of claim 17, further comprising:
forming the top plate of the capacitor device and the plurality of vias of the resistor device simultaneously by:
forming a plurality of via openings in the interlayer;
depositing a metallic material over the interlayer and into the plurality of via openings; and
etching the deposited metallic material to form the top plate and the plurality of vias.

20. The method of claim 17, further comprising:
forming the top plate of the capacitor device and the plurality of vias of the resistor device simultaneously by:
forming a cavity and a plurality of via openings in the interlayer;
depositing a metallic material into the cavity and the plurality of via openings; and
planarizing the deposited metallic material.

* * * * *